(12) United States Patent
Hew

(10) Patent No.: US 8,997,033 B1
(45) Date of Patent: Mar. 31, 2015

(54) TECHNIQUES FOR GENERATING A SINGLE CONFIGURATION FILE FOR MULTIPLE PARTIAL RECONFIGURATION REGIONS

(71) Applicant: Altera Corporation, San Jose, CA (US)

(72) Inventor: Yin Chong Hew, Selama (MY)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/197,918

(22) Filed: Mar. 5, 2014

(51) Int. Cl.
*G06F 17/50* (2006.01)

(52) U.S. Cl.
CPC ........ *G06F 17/5054* (2013.01); *G06F 17/5045* (2013.01); *G06F 17/505* (2013.01)
USPC .......................................... 716/116; 716/117

(58) Field of Classification Search
CPC   G06F 17/5045; G06F 17/505; G06F 17/5054
USPC ................ 326/37, 38, 41; 716/116–117, 138; 717/136, 140
See application file for complete search history.

(56) References Cited

U.S. PATENT DOCUMENTS

| | | | | |
|---|---|---|---|---|
| 6,553,523 | B1 * | 4/2003 | Lindholm et al. ............ | 714/725 |
| 7,111,214 | B1 * | 9/2006 | Chaudhary et al. .......... | 714/725 |
| 7,257,803 | B1 * | 8/2007 | Wilton et al. ................. | 716/105 |
| 7,600,210 | B1 * | 10/2009 | Mason et al. ................. | 716/138 |
| 7,619,442 | B1 | 11/2009 | Mason et al. | |
| 7,640,526 | B1 * | 12/2009 | Blodget et al. ............... | 716/138 |
| 7,669,163 | B1 | 2/2010 | Camilleri et al. | |
| 7,788,478 | B2 * | 8/2010 | Redgrave et al. ............ | 713/100 |
| 7,890,917 | B1 * | 2/2011 | Young et al. ................. | 716/117 |
| 8,352,898 | B1 * | 1/2013 | Kellermann ................. | 716/117 |
| 8,364,946 | B2 * | 1/2013 | Ishebabi ...................... | 713/100 |
| 8,415,974 | B1 * | 4/2013 | Lysaght ........................ | 326/39 |
| 8,433,891 | B2 * | 4/2013 | Redgrave et al. ............ | 713/100 |
| 8,560,996 | B1 * | 10/2013 | Brebner et al. .............. | 716/117 |
| 8,710,864 | B2 * | 4/2014 | Dasu et al. ................... | 326/38 |
| 8,719,750 | B1 * | 5/2014 | Balzli, Jr. .................... | 716/113 |
| 8,745,604 | B1 * | 6/2014 | Agarwal ...................... | 717/149 |
| 8,786,310 | B1 | 7/2014 | Lu et al. | |
| 2001/0056570 | A1 * | 12/2001 | Agrawal et al. .............. | 716/16 |
| 2003/0229877 | A1 * | 12/2003 | Bersch et al. ................ | 716/16 |
| 2004/0196065 | A1 * | 10/2004 | Madurawe .................... | 326/41 |
| 2005/0242834 | A1 * | 11/2005 | Vadi et al. .................... | 326/37 |
| 2007/0283311 | A1 * | 12/2007 | Karoubalis et al. .......... | 716/16 |
| 2010/0180246 | A1 * | 7/2010 | Cheung et al. ................ | 716/6 |
| 2010/0283505 | A1 * | 11/2010 | Koch et al. ................... | 326/41 |
| 2014/0109031 | A1 * | 4/2014 | Dutt et al. ................... | 716/117 |

\* cited by examiner

*Primary Examiner* — Stacy Whitmore
(74) *Attorney, Agent, or Firm* — Jason Tsai

(57) ABSTRACT

Techniques for compiling an integrated circuit (IC) design with a computer-aided design tool are provided. The IC design may include multiple dynamic configuration regions that may be updated during runtime without affecting other regions on the IC device. When an IC design is compiled for an IC device, dynamic configuration regions in the IC design are identified. The computer-aided design tool may generate a partial configuration file for each identified dynamic configuration region. Two or more partial reconfiguration files may be combined to obtain a single partial configuration file that may then be used to configure respective dynamic configuration regions on the IC device.

15 Claims, 8 Drawing Sheets

TECHNIQUES FOR GENERATING A SINGLE CONFIGURATION FILE FOR MULTIPLE PARTIAL RECONFIGURATION REGIONS

BACKGROUND

Programmable integrated circuit (IC) devices such as field programmable gate array (FPGA) devices may include logic elements that can be configured to perform any of a variety of functions. A common feature of most FPGA devices, known as partial reconfiguration, further allows a subset of logic elements in the FPGA to be dynamically reconfigured while the remaining logic elements continue to operate undisturbed. As such, predefined regions or logic elements in the device may be updated without disrupting applications running in other parts of the device.

Generally, a circuit designer may use an electronic design automation (EDA) or computer-aided design (CAD) tool to create a design for an IC device. If the IC device is a programmable device (e.g., an FPGA device), the circuit designer may specify specific regions on the device as partial reconfiguration regions. When the design is compiled, the EDA tool may generate a full-chip configuration bitstream and a partial configuration bitstream for each of the specified partial reconfiguration regions.

Typically, the circuit designer may perform an initial full-chip configuration by downloading the full-chip configuration bitstream to the device. The circuit designer may then use the partial configuration bitstream(s) generated by the EDA tool to reconfigure the predefined partial reconfiguration region(s) on the device at a later time without affecting other regions in the device (e.g., non-partial reconfiguration region in the device may continue to operate while the predefined regions are being reconfigured).

However, as a different partial configuration bitstream is generated for each partial reconfiguration region, the circuit designer may need to keep track of a high number of different partial configuration bitstream files. As an example, if there are ten partial reconfiguration regions in the design, the EDA tool may generate ten different partial configuration bitstream files. Additionally, the circuit designer may only reconfigure a single reconfiguration region in the device at any one time. As such, when multiple partial reconfiguration regions on the device need to be updated at a later time, each partial reconfiguration region needs to be updated individually using its own partial configuration bitstream.

It is within this context that the embodiments described herein arise.

SUMMARY

Techniques for generating a single configuration file for two or more partial reconfiguration regions on an integrated circuit (IC) device are provided. Embodiments of the present invention include methods to merge two or more partial reconfiguration bitstream files to obtain a single merged reconfiguration bitstream file. Multiple reconfiguration regions on the IC device may thus be configured concurrently using the merged reconfiguration bitstream file.

It is appreciated that the present invention can be implemented in numerous ways, such as a process, an apparatus, a system, a device or a computer readable medium. Several inventive embodiments of the present invention are described below.

A method of compiling an IC design for an IC device with a computer-aided design tool is provided. A step in the method includes identifying dynamic configuration regions in the IC design. In one scenario, a dynamic configuration region is a region on the IC device that may be updated or reconfigured at a later time without affecting other regions on the IC device. When compiling the IC design, the computer-aided design tool may generate a partial configuration file for each identified dynamic configuration region. The partial configuration file may be used to update an associated dynamic configuration region on the IC device. The computer-aided design tool may combine two or more partial configuration files to produce a single partial configuration file that may be used to update two or more respective dynamic configuration regions on the IC device.

A method of generating a single configuration file that is associated with at least two dynamic configuration regions on an IC device includes receiving an integrated circuit design for the integrated circuit device with a computer-aided design tool. At least two dynamic configuration regions in the IC design may be identified with the computer-aided design tool. Settings files are generated for the identified dynamic configuration regions. As an example, one settings file may be generated for each identified dynamic configuration region in the IC design. The generated settings files may be combined to generate a merged settings file. The merged settings file may contain settings for all the associated dynamic configuration regions. Accordingly, the single dynamic configuration file may be generated based at least in part on the merged settings file. The single dynamic configuration file may be used to configure two or more dynamic configuration regions on the integrated circuit device concurrently during runtime.

Software on a non-transitory computer readable medium includes code for receiving circuitry design data associated with an integrated circuit device with a computer-aided design tool. The IC device may include multiple partial reconfiguration regions, which may be configured during runtime without affecting other regions on the IC device. The software further includes code for generating partial reconfiguration bitstream files for the respective partial reconfiguration regions on the IC device. Code in the software may combine at least two of the generated partial reconfiguration bitstream files to generate a merged partial reconfiguration bitstream file for the respective partial reconfiguration regions. The single merged partial reconfiguration bitstream file may accordingly be used to configure the respective partial reconfiguration regions on the IC device.

DETAILED DESCRIPTION

The embodiments provided herein include techniques to generate a single partial reconfiguration file for two or more partial reconfiguration regions on an integrated circuit (IC) device.

It will be obvious, however, to one skilled in the art, that the present exemplary embodiments may be practiced without some or all of these specific details. In other instances, well-known operations have not been described in detail in order not to unnecessarily obscure the present embodiments.

Figure 1:
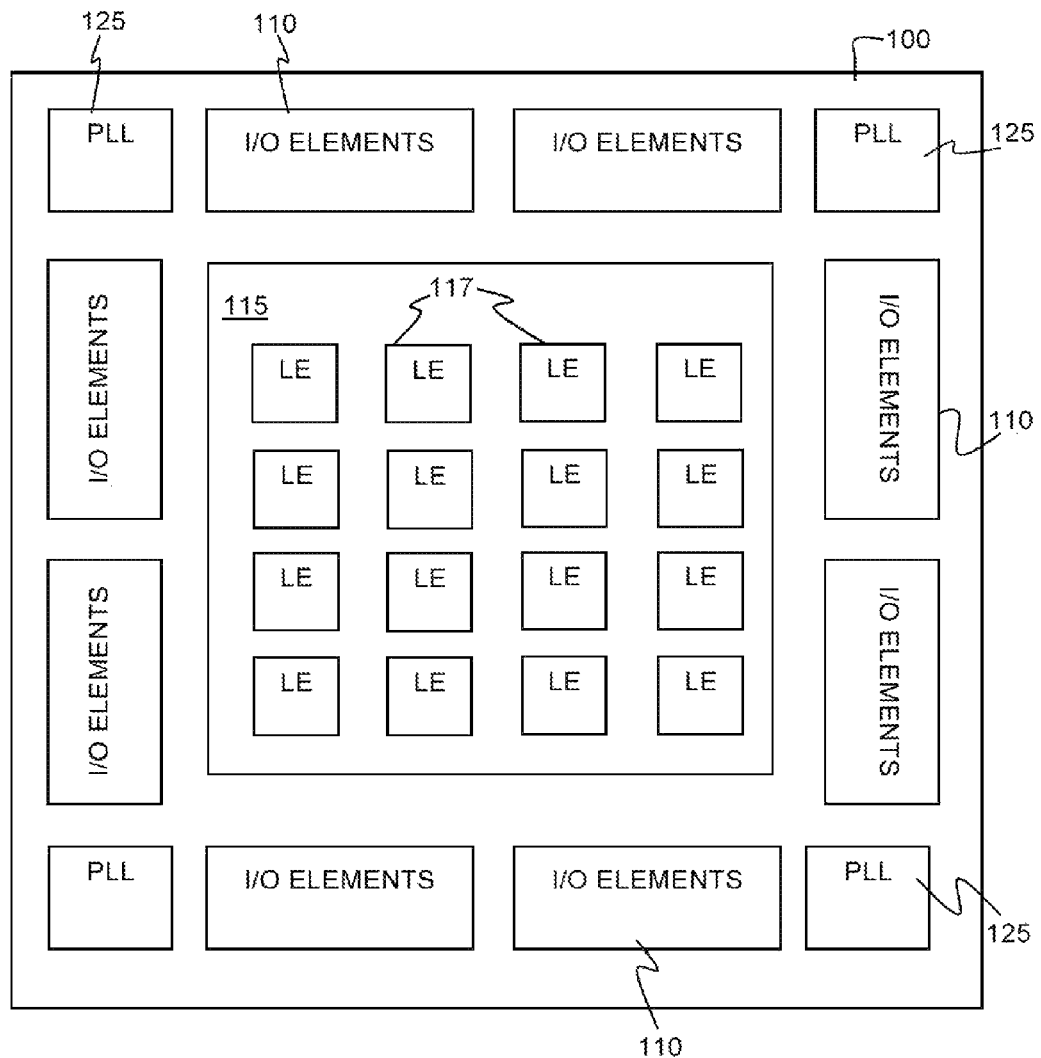
FIG. 1 is a simplified block diagram of an integrated circuit in accordance with embodiments of the present invention.

An IC device such as a field-programmable gate array (FPGA) device, generally includes, among others, memory modules, logic blocks, clock generation circuitry, and input-output elements. FIG. 1, meant to be illustrative and not limiting, shows a simplified block diagram of IC 100. IC 100 includes core logic region 115 and input-output elements 110. Other auxiliary circuits, such as phase-locked loops (PLLs) 125, for clock generation and timing, can be located outside core logic region 115 (e.g., at corners of IC 100 and adjacent to input-output elements 110).

Signals received from external circuitry at input-output elements 110 may be routed from input-output elements 110 to core logic region 115 or other logic blocks (not shown) on IC 100. Accordingly, signals may be sent from core logic region 115 and other relevant logic blocks of IC 100 to other external circuitry or components that may be connected to IC 100 through input-output elements 110. It should be noted that a single device like IC 100 can potentially support a variety of different interfaces and each individual input-output bank 110 may support a different input-output standard with a different interface or a different voltage level.

Core logic region 115 may be populated with logic cells that may include "logic elements" (LEs) 117, among other circuits. In one embodiment, LEs 117 may include look-up table-based logic regions and may be grouped into "Logic Array Blocks" (LABs). LEs 117 and groups of LEs or LABs may be configured to perform specific user functions. Configuration data loaded into configuration memory (not shown) may be used to produce control signals that configure LEs 117 and groups of LEs and LABs to perform the desired user functions.

As an example, a circuit designer may design a circuit that performs specific logic functions. Typically, a circuit designer may use a computer-aided design tool or an electronic design automation (EDA) tool when designing a circuit. The process of designing a circuit to be implemented on an IC device such as IC 100 may be done in several steps with a typical EDA tool. The EDA tool may accordingly produce an output file (e.g., a configuration file) that is then used to configure the IC device with the user design. Accordingly, configuration data (from the configuration file) loaded into configuration memory on IC 100 may be used to produce control signals that configure any of the LEs 117 and groups of LEs and LABs to perform desired logical functions.

In some instances, the circuit designer may define certain regions or logic blocks on the IC device as dynamic configuration regions, commonly referred to as partial reconfiguration regions. When the EDA tool compiles the design, multiple partial configuration files may be generated for the predefined dynamic configuration regions. The partial configuration output files may then be used to reconfigure the respective partial reconfiguration regions (i.e., the dynamic configuration regions) at a later time (e.g., during normal operation of the IC device) without disrupting applications that are running on other parts (i.e., static region or regions not defined as partial reconfiguration regions) of the IC device.

Figure 2:
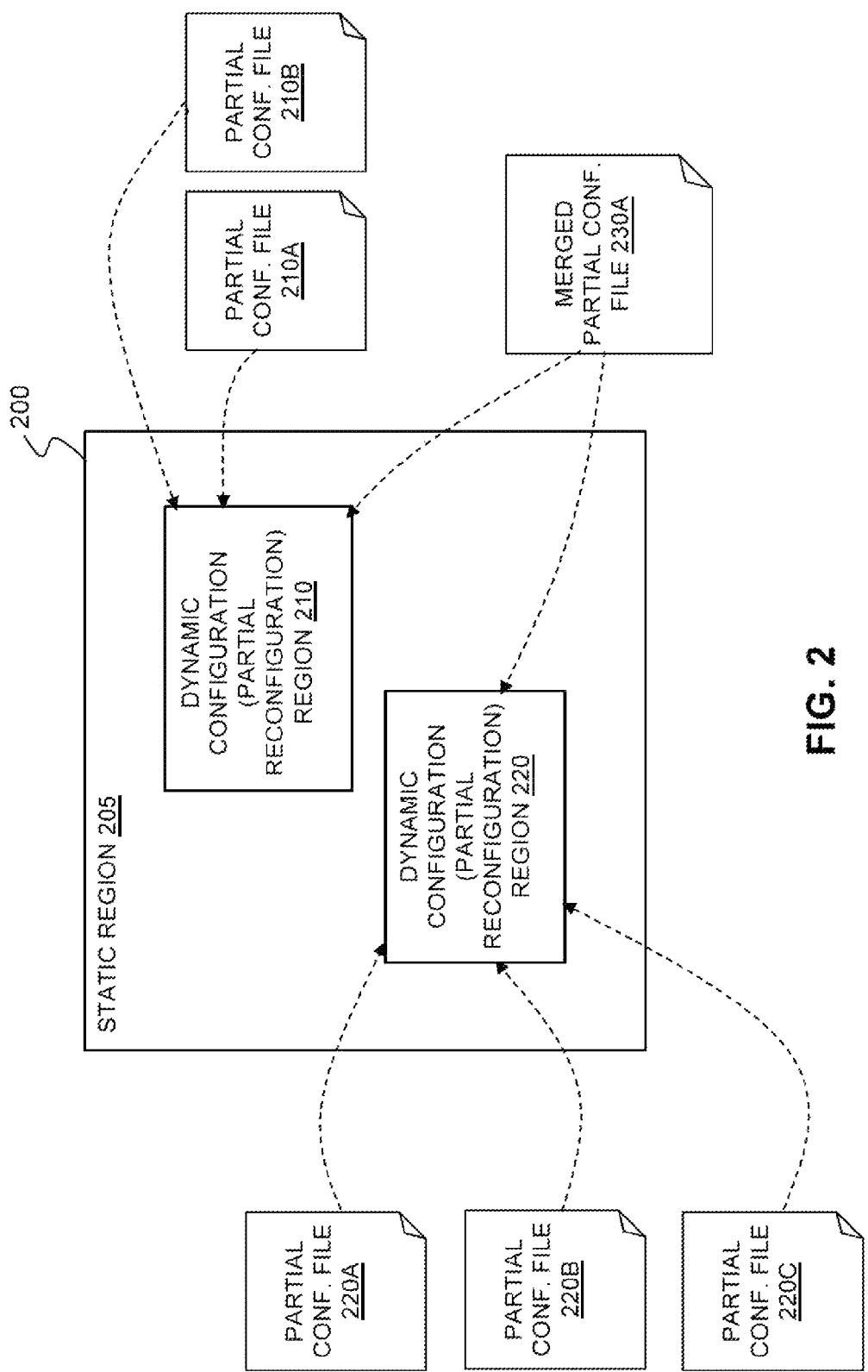
FIG. 2 shows an illustrative block diagram of an integrated circuit with two dynamic configuration regions in accordance with embodiments of the present invention.

FIG. 2 shows an illustrative block diagram of IC device 200 with static region 205 and two dynamic configuration regions 210 and 220 in accordance with embodiments of the present invention. It should be noted that IC device 200 may be a programmable logic device such as an FPGA device that may be programmed and reprogrammed with a modified design. Dynamic configuration regions 210 and 220 on IC device 200 are regions that may further be reprogrammed with a partial configuration bit file (or multiple partial configuration bit files) when IC device 200 is running. As an example, IC device 200 may first be configured with a full-chip bit file that configures the whole of IC device 200 (i.e., static region 205 and dynamic configuration regions 210 and 220). After IC device 200 has been fully configured, either one of dynamic configuration regions 210 and 220 may be reconfigured with a partial configuration bit file during runtime (e.g., while IC device 200 is operating or running) without affecting applications running in static region 205.

Generally, dynamic configuration regions 210 and 220 need to be configured separately with their respective partial configuration bit files and only one dynamic configuration region may be configured at any one time. For example, if both dynamic configuration regions 210 and 220 need to be reconfigured, dynamic configuration region 210 may need to be reconfigured with partial configuration bit file 210A or 210B first before dynamic configuration region 220 is reconfigured with partial configuration bit file 220A, 220B or 220C.

In order to improve the reconfiguration process (e.g., either by speeding up the process or reducing the number of partial configuration bit files generated), the partial configuration bit files for the respective dynamic configuration regions (e.g., dynamic configuration regions 210 and 220) may be combined or merged as a single partial configuration bit file. As an example, partial configuration bit file 210A may be combined or merged with partial configuration bit file 220B as a single merged partial configuration bit file 230A. The merged partial configuration bit file 230A may then be used to reconfigure both dynamic configuration regions 210 and 220 while IC device 200 is running.

As described above, the partial configuration bit files may be generated by the EDA tool that is used to compile the user design. In one embodiment, the EDA tool may combine or merge two or more of the generated partial configuration bit files as a single merged partial configuration bit file. In one scenario, the user may specify which partial configuration bit files are to be merged and the EDA tool accordingly merges or combines the selected files to generate a single merged partial configuration bit file. The merged partial configuration bit file may then be used by the user to reconfigure the respective dynamic configuration regions (e.g., dynamic configuration regions 210 and 220).

Figure 3:
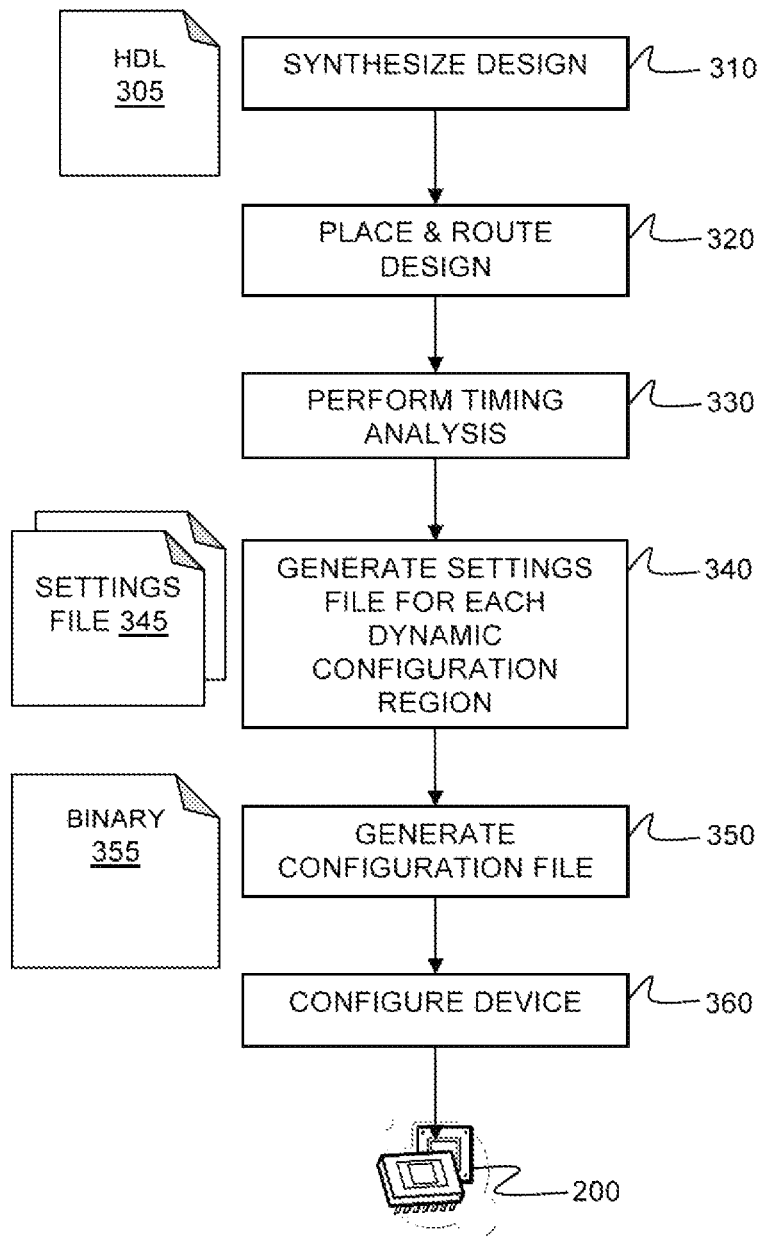
FIG. 3 is a flow chart of illustrative steps involved in creating and compiling a circuit design for an integrated circuit using an electronic design assistant (EDA) tool in accordance with embodiments of the present invention.

FIG. 3 is a flow chart of illustrative steps involved in creating and compiling a circuit design for an integrated circuit using an electronic design assistant (EDA) tool in accordance with embodiments of the present invention. Generally, a circuit designer or engineer may create a circuit design that is embodied in a hardware description language (HDL) file 305.

The circuit design may be created using the EDA tool or may be provided by the user as an input to the EDA tool.

At step 310, HDL file 305 may be synthesized by the EDA tool. For instance, the synthesis operation performed at step 310 may translate the circuit design embodied in HDL file 305 into a discrete netlist of logic-gate primitives. The synthesized logic gates in the circuit design are then placed and routed on a target IC device at step 320. It should be noted that the circuit designer may define specific regions on the IC device as partial reconfiguration regions or dynamic configuration regions (e.g., dynamic configuration regions 210 and 220 shown in FIG. 2).

After the place and route operation, at step 330, a timing analysis tool (e.g., a timing analyzer built into the EDA tool) may perform a timing analysis operation on the circuit design. It should be appreciated that the timing analysis operation may compute the lengths of different paths in the circuit design and may compute various timing constraints within the overall circuit design.

At step 340, prior to generating a full-chip configuration bit file, the EDA tool may generate a settings file 345 (which may alternatively be referred to as a mask file) for each dynamic configuration region defined by the user or circuit designer. In one scenario, the settings file 345 may include information that indicates which parts of the IC device (e.g., portions of the core logic and routing) that may be reconfigured at a later time (e.g., during runtime or normal operation of the IC device). The EDA tool may generate a settings file at step 340 for each dynamic configuration region.

At step 340, the EDA tool may then generate binary configuration file 355. Binary configuration file 355 may be a full-chip configuration bit file that contains a description of the circuit design and may be used to configure or program the IC device (e.g., contents of binary configuration file 355 may be loaded into configuration memory on IC device 300) at step 360. Data in binary configuration file 355 may be combined with settings file(s) 345 generated at step 340 to produce a partial configuration bistream for each partial reconfiguration region (or dynamic configuration region) in the IC design.

In one scenario, multiple settings files 345 may first be merged as a single settings file before being combined with data in binary configuration file 355 to obtain a merged partial configuration bitstream that may then be used to update two or more dynamic configuration regions in the IC device in a single partial reconfiguration operation. In another scenario, each settings file 345 generated by the EDA tool may first be combined with data in binary configuration file 355 to obtain individual partial configuration files for the respective partial reconfiguration regions in the IC design. Selected individual partial configuration files may then be combined to obtain a merged partial configuration file. In both scenarios, the EDA tool may allow the user or circuit designer to select specific combinations of mask files or individual partial configuration files to be merged.

Figure 4:
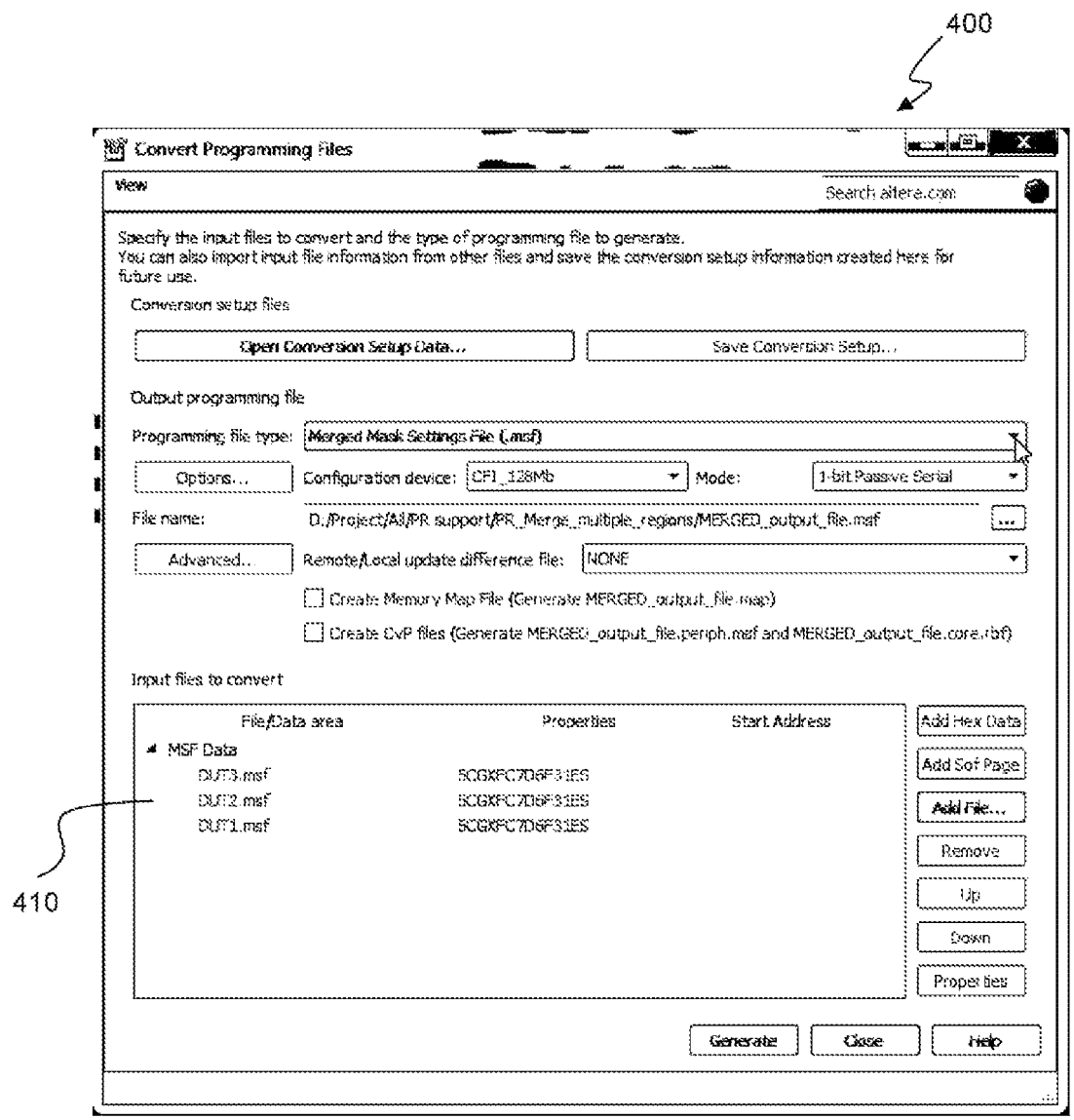
FIG. 4 shows an illustrative graphical user interface (GUI) of an EDA tool that may allow a user to select specific settings files (or partial configuration files) to be merged in accordance with embodiments of the present invention.

FIG. 4 shows an illustrative graphical user interface (GUI) 400 of an EDA tool that may allow a user to select specific settings files (or partial configuration files) to be merged in accordance with embodiments of the present invention. Input area 410 in GUI 400 may be adapted to receive user input. In one scenario, the user may add selected settings files (such as settings file 345 described above with reference to FIG. 3) or individual partial configuration files generated by the EDA tool to input area 410. It should be noted that even though a specific GUI layout with specific options is shown in FIG. 4, a different GUI layout with different options or even a different input interface (e.g., a text interface) may be used in this context.

As described above, a settings file may be generated for each dynamic configuration region defined in the circuit design. In the example of FIG. 4, three settings files are selected (as listed in input area 410). In this example, the three settings files may be merged or otherwise combined to obtain a single merged settings file that may then be used to obtain a single merged partial configuration bitstream. The generated merged partial configuration bitstream may accordingly be used to configure or program the three different dynamic configuration regions on the IC device at a later stage.

In one embodiment, the EDA tool may analyze the selected settings files based on a set of predefined rules to determine whether the settings files may be combined before merging the selected settings files. In one scenario, the EDA tool may only merge the selected settings files if they conform to the predefined rules. Alternatively, the user may select individual partial configuration files to be merged and the EDA tool may accordingly analyze and merge the selected files based on another set of predefined rules.

Figure 5A:
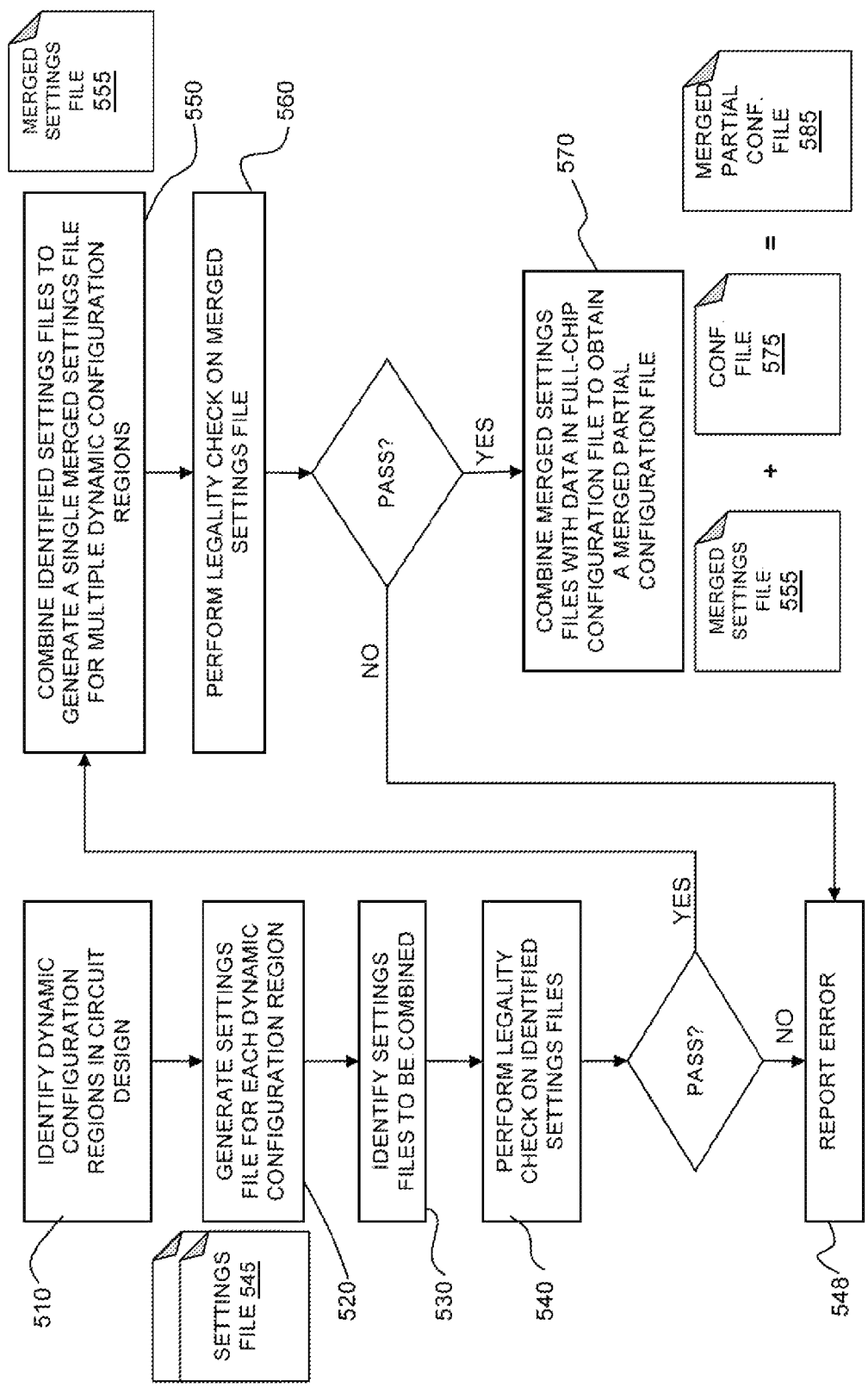
FIG. 5A is a flow chart of illustrative steps involved in combining two or more settings files using an electronic design assistant (EDA) tool to obtain a single merged settings file in accordance with embodiments of the present invention.

FIG. 5A is a flow chart of illustrative steps involved in combining two or more settings files using an electronic design assistant (EDA) tool to obtain a single merged settings file in accordance with embodiments of the present invention. At step 510, the EDA tool may identify dynamic configuration regions in a provided circuit design. Based on the identified dynamic configuration regions, the EDA tool may generate a settings file for each dynamic configuration region defined in the circuit design at step 520. It should be noted that the steps shown in FIG. 5A may be performed as part of a circuit design compilation process as described above with reference to FIG. 3. For example, settings files 545 generated at step 520 may be similar to settings files 345 generated at step 340 of FIG. 3.

At step 530, the settings files 545 to be combined are identified by the EDA tool. As shown in FIG. 4, the EDA tool may include a GUI or any other input interface that allows the user to select specific settings files to be combined or merged. After the selected settings files have been identified, the EDA tool may perform a legality check on the identified settings files at step 540 based on a set of predefined rules to ensure that the selected settings files are compatible with each other. In one scenario, this may include determining that all the selected settings files were generated for the same circuit design, and that settings in the selected settings files have the same data array size, and so on.

If the selected settings files do not pass the legality check at step 540, the EDA tool may report an error at step 548 and the selected settings files may not be combined. If the selected settings files pass the legality check at step 540, the EDA tool may combine the selected settings files at step 550 to generate a single merged settings file 555 for multiple dynamic configuration (or partial reconfiguration) regions in the circuit design. In one embodiment, each settings file 545 includes arrays of binary bits representing different settings for its corresponding dynamic configuration region. Accordingly, the EDA tool may perform an OR operation on the respective binary bits in the selected settings files to produce a set of merged data bits in merged settings file 555.

In one scenario, after the merging operation, a legality check may be performed at step 560 on the merged settings file 555 to ensure that the merging operation is valid. As mentioned above, a settings file such as settings file 555 may contain setting bits or multiple bit arrays. As such, in one scenario, when merging two or more settings files, the respective bit arrays in the settings files may not have overlapping bits at the same address or bit array location (details of which will be explained further with reference to FIG. 5B). If the merged settings file 555 does not pass the legality check at step 560, the EDA tool may report an error at step 548. It should be appreciated that the legality check at step 560 (e.g., checking for overlapping bits in the settings files) may be performed on the selected settings files prior to the merging operation at step 550 if desired. In one scenario, the settings files may be checked for overlapping bits as part of the initial legality check performed at step 540. In this scenario, if the selected settings files have overlapping bits, they are not merged and the EDA tool may accordingly report an error to indicate that the selected settings files have overlapping bits.

If the merged settings file 555 is valid and passes the legality check at step 560, the EDA tool may combine the merged settings file 555 with data in the full-chip configuration bit file 575 (assuming full-chip configuration bit file 575 has been generated for the circuit design as part of the compilation process) to obtain a partial configuration file at step 570. The partial configuration file 585 generated at step 570 is a merged partial configuration file that may be used to configure two or more dynamic configuration regions concurrently on the IC device at a later time (e.g., when the IC device is up and running).

Figure 5B:
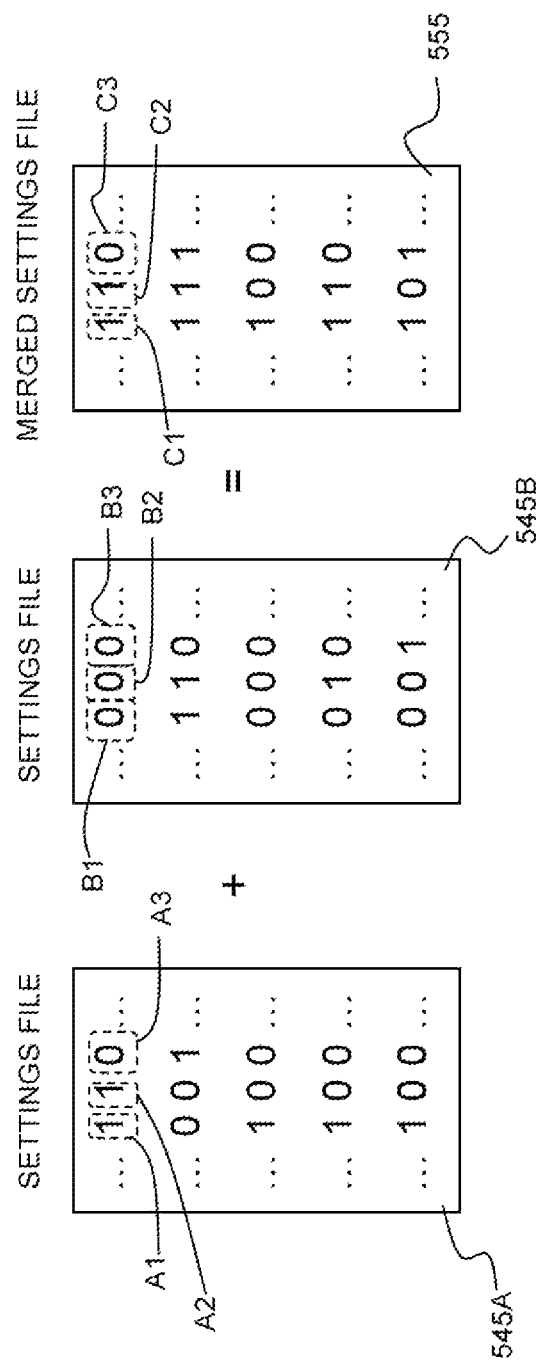
FIG. 5B shows illustrative bits in two settings files and a merged settings file in accordance with embodiments of the present invention.

FIG. 5B shows illustrative bits in two settings files and a merged settings file in accordance with embodiments of the present invention. Settings files 545A and 545B may be generated by an EDA tool for two different dynamic configuration regions in a circuit design (as shown at step 520 of FIG. 5A). Each settings file may have arrays of binary bits. In one scenario, the size of the respective bit arrays in settings files 545A and 545B may be similar.

In one embodiment, in order to merge settings files 545A and 545B, an OR operation may be performed on the respective bits in both files. Merged settings file 555 in FIG. 5B shows the results of the OR operation performed on respective bits in settings file 545A and 545B. In one scenario, settings file 545A and 545B may only be merged if there are no overlapping logic high bits (e.g., 1) at the same address location. For example, in FIG. 5B, bits A1, A2 and A3 in settings file 545A correspond respectively with bits B1, B2 and B3 in settings file 545B. In this example, settings files 545A and 545B may be combined because there are no overlapping logic high bits. Alternatively, if either one of bits B1 and B2 is a 1, then both settings files may not be combined as there is an overlapping logic high bit at the same address location.

Figure 6:
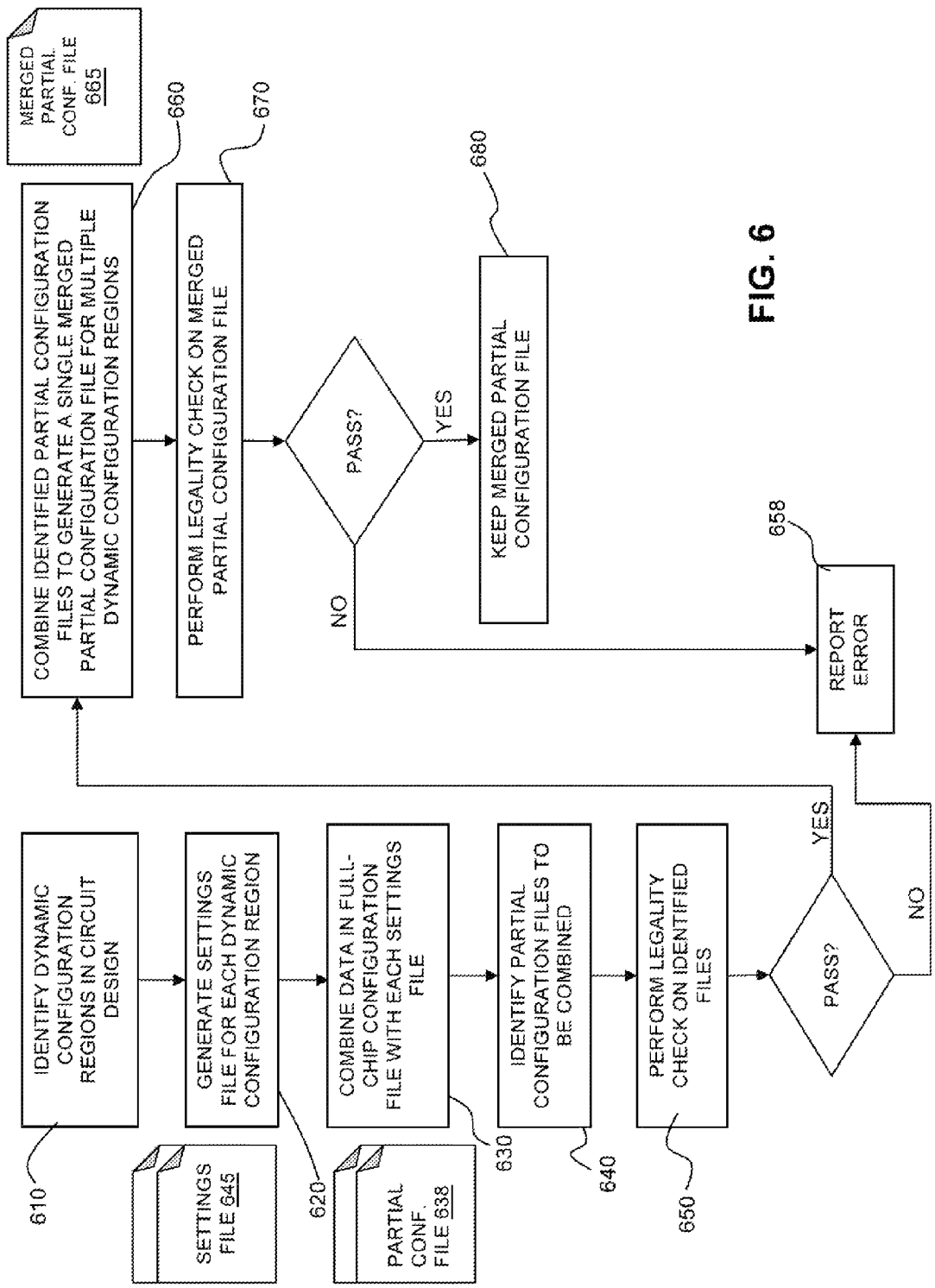
FIG. 6 is a flow chart of illustrative steps involved in combining two or more partial configuration files using an electronic design assistant (EDA) tool to obtain a single merged configuration file in accordance with embodiments of the present invention.

FIG. 6 is a flow chart of illustrative steps involved in combining two or more partial configuration files using an electronic design assistant (EDA) tool to obtain a single merged configuration file in accordance with embodiments of the present invention. As described above, instead of first combining the generated settings files before generating a merged partial configuration file, multiple partial configuration files may be generated and merged at a later stage. Accordingly, it should be noted that certain steps in FIG. 6 may be similar to steps shown in FIG. 5A.

At step 610, the EDA tool may identify dynamic configuration regions in a provided circuit design. The EDA tool may then generate a settings file 645 (similar to settings file 545 in FIG. 5A) for each dynamic configuration region defined in the circuit design at step 620. At step 630 the EDA tool may combine each of the settings file 645 generated at step 620 with data in a full-chip configuration file (e.g., full-chip configuration file 575 of FIG. 5A) to obtain individual partial configuration files 638 for the respective dynamic configuration regions in the circuit design.

At step 640, selected partial configuration files 638 to be combined are identified by the EDA tool. As an example, the EDA tool may provide a GUI interface as shown in FIG. 4 that lets the user select specific partial configuration files to be combined. After the selected partial configuration files have been identified, the EDA tool may perform a legality check on the identified partial configuration files at step 650 based on a set of predefined rules to ensure that the selected partial configuration files are compatible with each other. In one scenario, this may include determining that all the selected partial configuration files have been generated for the same circuit design, and that the selected partial configuration files have the same data array size.

If the selected partial configuration files do not pass the legality check at step 650, the EDA tool may report an error at step 658 and the selected partial configuration files may not be combined. If the selected partial configuration files pass the legality check at step 650, the EDA tool may then combine the selected partial configuration files at step 660 to generate a single merged partial configuration file 665 for two or more dynamic configuration regions in the circuit design. In one scenario, each partial configuration file 638 may include configuration bits for its corresponding dynamic configuration region. Accordingly, to merge two or more partial configuration files 638, the EDA tool may perform an OR operation on the respective configuration bits in the selected partial configuration files to produce a set of merged configuration bits in merged partial configuration file 665.

In one embodiment, the EDA tool may further perform a legality check on the merged partial configuration file 665 at step 670. This may include, among others, ensuring that the merging operation performed at step 660 is valid, and that the merged configuration bits does not conflict with the bits in the static region. If data (e.g., results of the OR operation) in merged partial configuration file 665 is invalid or erroneous, the EDA tool may report an error at step 658. If the generated merged partial configuration file 665 passes the legality check at step 670, the EDA may keep the merged partial configuration file at step 680. The user may accordingly use merged partial configuration file 665 to configure two or more respective dynamic configuration regions (e.g., dynamic configuration regions 210 and 220 of FIG. 2) on the IC device at a later time. It should be noted that the legality check at step 670 may be performed prior to the combining/merging operation at step 660. In one scenario, overlapping bits or conflicting bits in the identified partial configuration files may be checked as part of the legality check performed at step 650. If the identified partial configuration files have conflicting configuration bits (e.g., in the static region), then the partial configuration files may not be combined and the EDA tool may report an error at step 658.

Figure 7:
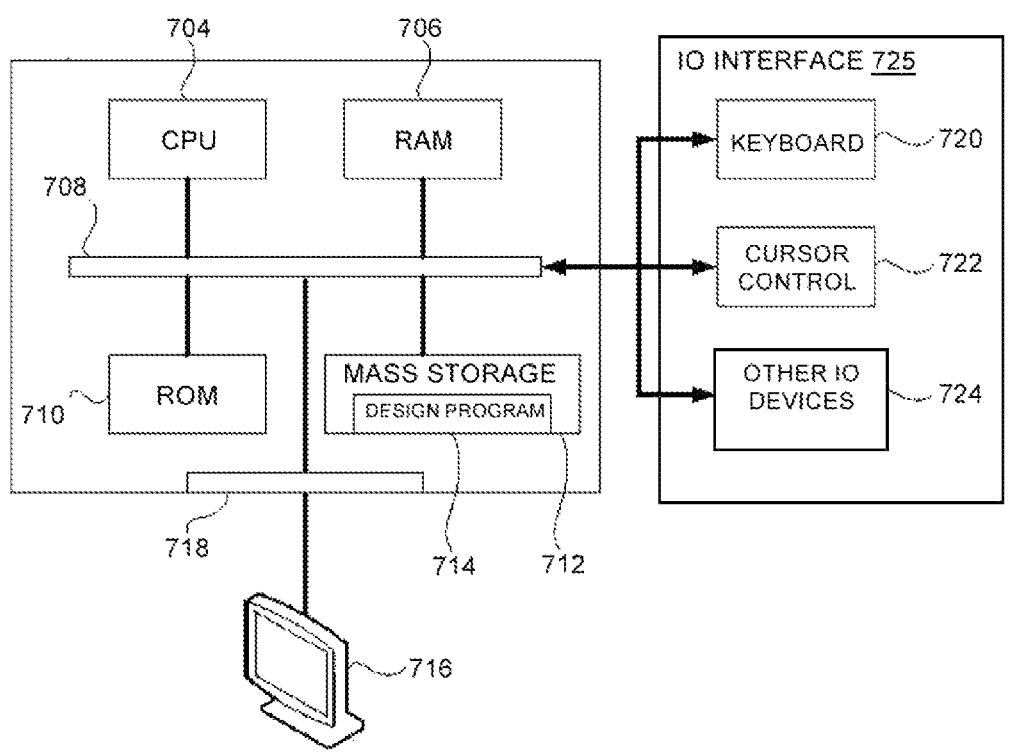
FIG. 7 depicts an illustrative schematic diagram of a computer system for implementing embodiments of the present invention.

FIG. 7 is a simplified schematic diagram of a computer system for implementing embodiments of the present invention. It should be appreciated that the methods described herein may be performed with a digital processing system, such as a conventional, general-purpose computer system. Special-purpose computers, which are designed or programmed to perform one function may be used in the alternative. Accordingly, the computer system of FIG. 7 may be used to design an IC. The computer system includes a central processing unit (CPU) 704, input-output interface 725 and display element 716. It should be appreciated that CPU 704 may be embodied in a general-purpose processor, a special-purpose processor, or a specially programmed logic device.

Referring still to FIG. 7, CPU 704 is coupled through bus 708 to random access memory (RAM) 706, read-only memory (ROM) 710, and mass storage device 712. Mass storage device 712 represents a persistent data storage device such as a fixed disc drive, or a flash-based drive, which may be local or remote. Design program 714 (e.g., an EDA tool that can perform any or all of the operations illustrated in FIGS. 3, 5A and 6A) resides in mass storage device 712, but can also reside in RAM 706 during processing. Display 716 is in communication with CPU 704, RAM 706, ROM 710, and mass storage device 712, through bus 718. Display 716 may also include touch sensors that may be used to receive inputs from a user. Input-output interface 725 includes keyboard 720, cursor control 722, and other input-output devices 724 (e.g., a Joint Test Action Group (JTAG) port, a peripheral component interconnect express (PCIe) slot, etc.) that may be supported by the computer system in FIG. 7. Input-output interface 725 is coupled to bus 708 to communicate with CPU 704. It should be appreciated that data to and from external devices (not shown) may be communicated through input-output interface 725.

It should be noted that any or all of the steps described above with reference to FIGS. 3, 5A and 6A may be embodied as machine-readable instructions on a non-transitory machine-readable storage medium. The non-transitory machine-readable storage medium may be any data storage device that can store data, which can thereafter be read by a machine or a computer system (e.g., the computer system shown in FIG. 7). Illustrative examples of such a medium include flash drives, hard drives, network attached storage (NAS), read-only memory, CDs, DVDs, USB drives, volatile and non-volatile memory, and other optical and non-optical data storage devices.

The embodiments, thus far, were described with respect to programmable logic circuits. The method and apparatus described herein may be incorporated into any suitable circuit. For example, the method and apparatus may also be incorporated into numerous types of devices such as microprocessors or other ICs. Exemplary ICs include programmable array logic (PAL), programmable logic arrays (PLAs), field programmable logic arrays (FPGAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by the assignee.

The foregoing is merely illustrative of the principles of this invention and various modifications can be made by those skilled in the art without departing from the scope and spirit of the invention.

What is claimed is:

1. A method of compiling an integrated circuit design, comprising:
with a computer-aided design tool implemented on computing equipment, identifying a plurality of dynamic configuration regions in the integrated circuit design;
for each identified dynamic configuration region of the plurality of dynamic configuration regions in the integrated circuit design, generating a partial configuration file;
combining at least two partial configuration files to obtain a single partial configuration file for at least two respective dynamic configuration regions in the plurality of dynamic configuration regions;
for each identified dynamic configuration region of the plurality of dynamic configuration regions, generating a settings file prior to generating the partial configuration file; and
generating a full-chip binary configuration file based on the integrated circuit design prior to combining the at least two partial configuration files, wherein generating the partial configuration file comprises combining at least a portion of the full-chip binary configuration file and the settings file to obtain the partial configuration file for each identified dynamic configuration region.

2. The method defined in claim 1, wherein the partial configuration file comprises a plurality of binary bits, and wherein combining the at least two partial configuration files comprises:
performing an OR operation on respective binary bits in the at least two partial configuration files, wherein the single partial configuration file contains results of the OR operation on the respective binary bits.

3. The method defined in claim 1 further comprising:
receiving user input; and
selecting the at least two partial configuration files that are combined into the single partial configuration file based at least partly on the received user input.

4. The method defined in claim 1 further comprising:
identifying an error in one of the at least two configuration files prior to combining the at least two partial configuration files; and
in response to identifying the error, outputting an error message.

5. The method defined in claim 4, wherein each of the at least two configuration files comprises an array of binary bits, and wherein identifying the error comprises:
identifying overlapping logic high bits in the array of binary bits in the at least two configuration files.

6. A method of generating a single configuration file associated with at least two dynamic configuration regions on an integrated circuit device, the method comprising:
with a computer-aided design tool implemented on a computer, receiving an integrated circuit design for the integrated circuit device;
identifying the at least two dynamic configuration regions in the integrated circuit design;
generating respective settings files for the at least two dynamic configuration regions, wherein each of the respective settings files comprises a plurality of binary bits;

performing a legality check on the settings files to determine whether the respective settings files can be combined;

in response to passing the legality check, combining the respective settings files to generate a merged settings file by performing an OR operation on the plurality of binary bits in the respective settings files; and generating the single configuration file based at least in part on the merged settings file, wherein the single configuration file is adapted to configure the at least two dynamic configuration regions on the integrated circuit device concurrently during runtime.

7. The method defined in claim 6 further comprising:
with the computer-aided design tool, compiling the received integrated circuit design to generate a full-chip binary configuration file for the integrated circuit device.

8. The method defined in claim 7, wherein generating the single configuration file comprises combining the merged settings file with at least a portion of the full-chip binary configuration file.

9. The method defined in claim 6 wherein performing the legality check on the settings files comprises:
identifying an error in the respective settings files prior to combining the respective settings files; and
in response to identifying the error, outputting an error message.

10. The method defined in claim 9, wherein each of the respective settings files comprises an array of binary bits, and wherein identifying the error comprises:
identifying overlapping logic high bits in the array of binary bits in the respective settings files.

11. Non-transitory computer-readable storage media for configuring an integrated circuit device, comprising instructions for:
receiving circuitry design data associated with an integrated circuit device having a plurality of partial reconfiguration regions;
generating partial reconfiguration bitstream files for respective partial reconfiguration regions of the plurality of partial reconfiguration regions;

combining at least two partial reconfiguration bitstream files for two respective partial reconfiguration regions to generate a merged partial reconfiguration bitstream file for the two respective partial reconfiguration regions;

after generating the partial reconfiguration bitstream files for the respective partial reconfiguration regions of the plurality of partial reconfiguration regions, receiving user input for selecting which of the partial reconfiguration bitstream files are to be combined; and in response to receiving the user input, selecting the at least two partial reconfiguration bitstream files to be combined to generate the merged partial reconfiguration bitstream file.

12. The non-transitory computer-readable storage media defined in claim 11 further comprising instructions for:
generating settings files for the respective partial reconfiguration regions prior to generating the partial reconfiguration bitstream files.

13. The non-transitory computer-readable storage media defined in claim 12 further comprising instructions for:
compiling the received circuitry design data for the integrated circuit device;
generating a configuration bitstream file for the integrated circuit device based on the received circuitry design data; and
combining the configuration bitstream file with the settings files for the respective partial reconfiguration regions to generate the partial reconfiguration bitstream files.

14. The non-transitory computer-readable storage media defined in claim 11 further comprising instructions for:
comparing the at least two partial reconfiguration bitstream files with a set of predefined rules prior to combining the at least two partial reconfiguration bitstream files.

15. The non-transitory computer-readable storage media defined in claim 11, wherein the at least two partial reconfiguration bitstream files comprise a plurality of binary bits each, and wherein the instructions for combining the at least two partial reconfiguration bitstream files comprises instructions for performing an OR operation on respective binary bits in the at least two partial reconfiguration bitstream files.

* * * * *